United States Patent
Gopalakrishna et al.

(10) Patent No.: US 12,159,802 B2
(45) Date of Patent: Dec. 3, 2024

(54) SHORTENED LOAD PORT FOR FACTORY INTERFACE

(71) Applicant: APPLIED MATERIALS, INC., Santa Clara, CA (US)

(72) Inventors: Srinivas Poshatrahalli Gopalakrishna, Bangalore (IN); Paul B. Reuter, Austin, TX (US); Devendra Channappa Holeyannavar, Bangalore (IN); Douglas B. Baumgarten, Round Rock, TX (US); Sushant S. Koshti, Sunnyvale, CA (US); Arunkumar Ramachandraiah, Bengaluru (IN); Narayanan Ramachandran, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/683,938

(22) Filed: Mar. 1, 2022

(65) Prior Publication Data
US 2022/0285193 A1 Sep. 8, 2022

Related U.S. Application Data

(60) Provisional application No. 63/156,621, filed on Mar. 4, 2021.

(51) Int. Cl.
*H01L 21/677* (2006.01)
*B25J 9/16* (2006.01)

(52) U.S. Cl.
CPC ...... *H01L 21/67775* (2013.01); *B25J 9/1687* (2013.01)

(58) Field of Classification Search
CPC ......... H01L 21/67775; H01L 21/67772; H01L 21/67389; H01L 21/67196
See application file for complete search history.

(56) References Cited

U.S. PATENT DOCUMENTS

| 5,376,212 A | 12/1994 | Saiki |
| 6,034,000 A | 3/2000 | Heyder et al. |

(Continued)

FOREIGN PATENT DOCUMENTS

| JP | H0927536 A | 1/1997 |
| JP | 2003045933 A | 2/2003 |

(Continued)

OTHER PUBLICATIONS

PCT International Search Report and Written Opinion for the International Application No. PCT/US2022/018768, mailed Jun. 21, 2022, 12 pages.

(Continued)

*Primary Examiner* — Glenn F Myers
(74) *Attorney, Agent, or Firm* — Lowenstein Sandler LLP

(57) ABSTRACT

The disclosure describes devices, systems, and methods for integrating load locks into a factory interface footprint space. A factory interface for an electronic device manufacturing system can include a load port for receiving a substrate carrier. The load port can include a frame adapted for connecting the load port to a factory interface, the frame comprising a transport opening through which one or more substrates are capable of being transported between the substrate carrier and the factory interface. The load port can also include an actuator coupled to the frame, and a load port door coupled to the actuator and configured to seal the transport opening. The frame height can be greater than the height of the load port door, and less than 2.5 times the height of the load port door.

18 Claims, 10 Drawing Sheets

(56) References Cited

U.S. PATENT DOCUMENTS

| | | | |
|---|---|---|---|
| 6,082,951 A * | 7/2000 | Nering | H01L 21/67772 |
| | | | 414/416.03 |
| 6,270,306 B1 | 8/2001 | Otwell et al. | |
| 6,486,444 B1 | 11/2002 | Fairbairn et al. | |
| 6,647,665 B1 | 11/2003 | Tabrizi et al. | |
| 7,010,388 B2 | 3/2006 | Mitchell et al. | |
| 7,419,346 B2 | 9/2008 | Danna et al. | |
| 7,699,574 B2 | 4/2010 | Ferrara | |
| 7,942,619 B2 * | 5/2011 | Hashimoto | H01L 21/67766 |
| | | | 414/217 |
| 7,949,425 B2 | 5/2011 | Mitchell et al. | |
| 9,312,153 B2 | 4/2016 | Hiroki | |
| 11,581,203 B2 | 2/2023 | Newman et al. | |
| 11,688,619 B2 | 6/2023 | Wakabayashi | |
| 2002/0094696 A1 | 7/2002 | Heyder et al. | |
| 2004/0234359 A1 | 11/2004 | Mitchell et al. | |
| 2006/0151735 A1 | 7/2006 | Lee et al. | |
| 2006/0245850 A1 * | 11/2006 | Hashimoto | H01L 21/67778 |
| | | | 414/217 |
| 2008/0093022 A1 | 4/2008 | Yilmaz et al. | |
| 2010/0190343 A1 | 7/2010 | Aggarwal et al. | |
| 2013/0115028 A1 | 5/2013 | Kremerman et al. | |
| 2014/0271054 A1 | 9/2014 | Weaver et al. | |
| 2014/0363258 A1 * | 12/2014 | Iwamoto | H01L 21/67775 |
| | | | 414/217 |
| 2016/0284578 A1 | 9/2016 | Weaver et al. | |
| 2017/0067163 A1 | 3/2017 | Papasouliotis et al. | |
| 2018/0068881 A1 | 3/2018 | Cavins et al. | |
| 2018/0151403 A1 * | 5/2018 | Smith | H01L 21/67766 |
| 2018/0229945 A1 * | 8/2018 | Suzuki | H01L 21/67201 |
| 2019/0355600 A1 | 11/2019 | Rice | |
| 2019/0362995 A1 * | 11/2019 | Ito | G06K 7/10366 |
| 2020/0219744 A1 * | 7/2020 | Kim | H01L 21/67739 |
| 2020/0312691 A1 * | 10/2020 | Kagami | H01L 21/67259 |

FOREIGN PATENT DOCUMENTS

| | | |
|---|---|---|
| JP | 4389424 B2 | 12/2009 |
| JP | 2010135495 A | 6/2010 |
| JP | 4712379 B2 | 6/2011 |
| JP | 2017108048 A | 6/2017 |
| JP | 2019161119 A | 9/2019 |
| KR | 20140133534 A | 11/2014 |

OTHER PUBLICATIONS

Final Office Action for U.S. Appl. No. 18/107,701, mailed Oct. 10, 2023, 16 Pages.

International Preliminary Report on Patentability for International Application No. PCT/US2021/048681, mailed Mar. 16, 2023, 7 Pages.

International Search Report and Written Opinion for International Application No. PCT/US2021/048681, mailed Dec. 1, 2021, 11 Pages.

International Search Report and Written Opinion for International Application No. PCT/US2022/046317, mailed Feb. 9, 2023, 11 Pages.

* cited by examiner

FIG. 1C

SHORTENED LOAD PORT FOR FACTORY INTERFACE

RELATED APPLICATION

This application claims the benefit of U.S. Provisional Application No. 63/156,621, filed Mar. 4, 2021, the entire content of which is hereby incorporated by reference.

TECHNICAL FIELD

Embodiments of the present disclosure relate, in general, to shortened load ports for a factory interface.

BACKGROUND

An electronic device manufacturing system can include one or more tools or components for transporting and manufacturing substrates. Such tools or components can include a factory interface connected to a load lock and/or transfer chamber. In some instances, the front face of the factory interface can include one or more load ports. A load port is a station for the input and output of substrate carriers. Current load ports consume a large vertical space. However, such a configuration can be inefficient because this configuration does not allow for other modules, such as substrate storage containers, metrology equipment, servers, and air conditioning units, to use the same vertical space. Thus, the overall footprint of the electronic device manufacturing system is increased because the other modules are positioned elsewhere on the factory floor. Accordingly, improved load ports for electronic device manufacturing systems having a reduced size are sought.

SUMMARY

Some of the embodiments described cover a load port for receiving a substrate carrier. The load port can include a frame adapted to connect the load port to a factory interface. The frame can include a transport opening through which one or more substrates are capable of being transported between the substrate carrier and the factory interface. The load port can include an actuator coupled to the frame and a load port door, capable of sealing the transport opening, coupled to the actuator. The actuator can position the load port door from a closed position to an open position, and vice versa. The overall height of the load port can be greater than the height of the load port door, but less than 2.5 times the height of the load port door.

In some embodiments, an electronic device manufacturing system include a factory interface and at least one load port for receiving a substrate carrier. The load port can include a frame adapted to connect the load port to a factory interface. The frame can include a transport opening through which one or more substrates are capable of being transported between the substrate carrier and the factory interface. The load port can include an actuator coupled to the frame and a load port door, capable of sealing the transport opening, coupled to the actuator. The actuator can position the load port door from a closed position to an open position, and vice versa. The overall height of the load port can be greater than the height of the load port door, but less than 2.5 times the height of the load port door.

In some embodiments, a method for transporting substrates from a substrate carrier to a factory interface includes receiving, by a load port, a substrate carrier. The load port includes include a frame adapted to connect the load port to a factory interface. The frame can include a transport opening through which one or more substrates are capable of being transported between the substrate carrier and the factory interface. The load port can include an actuator coupled to the frame and a load port door, capable of sealing the transport opening, coupled to the actuator. The actuator can position the load port door from a closed position to an open position, and vice versa. The overall height of the load port can be greater than the height of the load port door, but less than 2.5 times the height of the load port door The method further includes positioning the load port door from the first position to the second position. The method further includes retrieving, by a factory interface robot deposed within the factory interface, a substrate from the substrate carrier.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 1C is a front schematic view of an example electronic device manufacturing system, according to aspects of the present disclosure.

DETAILED DESCRIPTION OF EMBODIMENTS

Figure 1A:
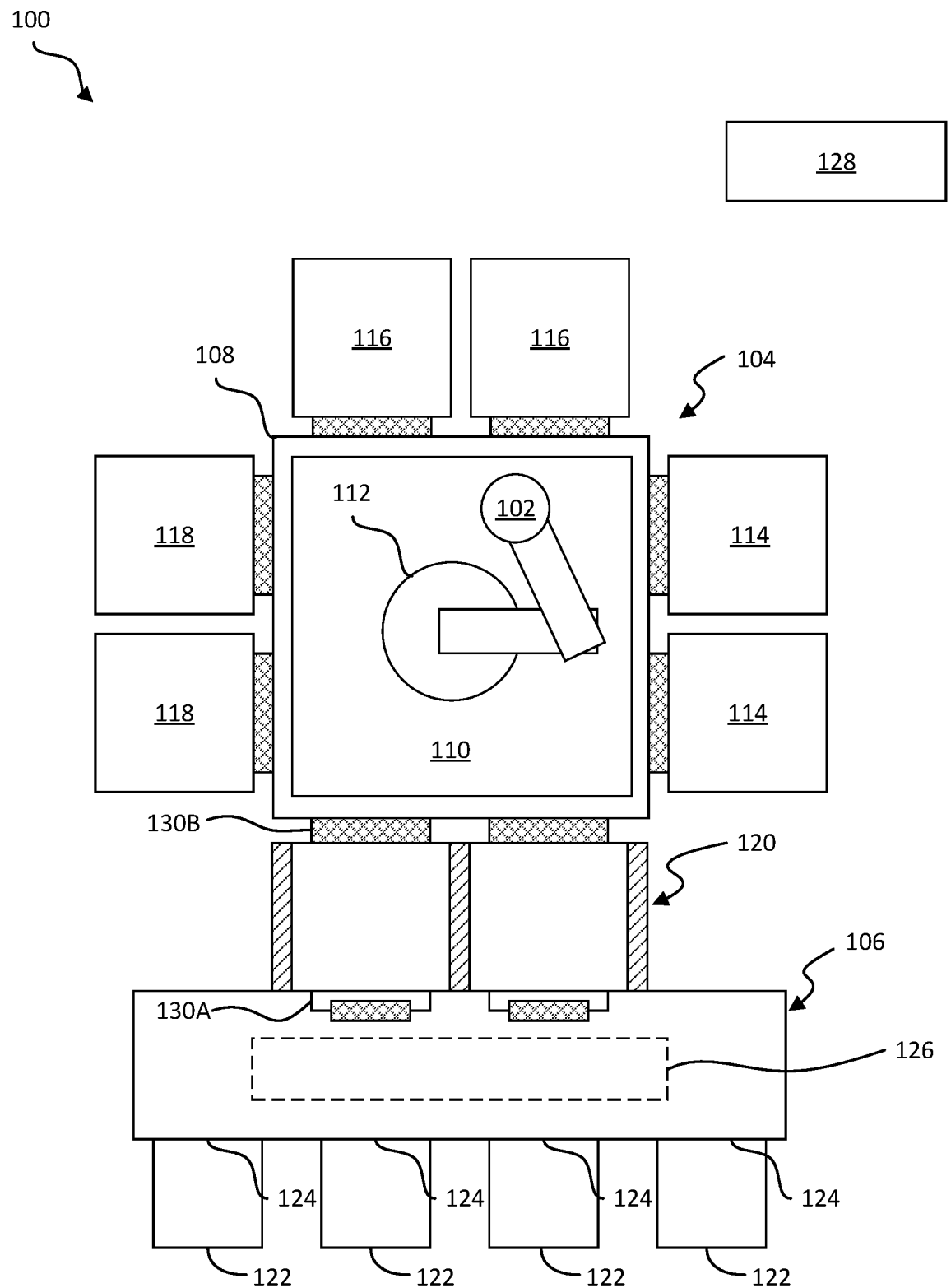
FIG. 1A is a top schematic view of an example electronic device manufacturing system, according to aspects of the present disclosure.

Embodiments described herein are related to systems and methods for shortened load ports for a factory interface. Embodiments cover designs for a load port that reduces the vertical space consumed of electronic device manufacturing systems. In some embodiments, the load port includes an actuator (e.g., a pneumatic mechanism, an electromechanically driven actuator, or a similar mechanism) for opening the load port door that enables reducing the overall height of the load port as compared to traditional load ports. In some embodiments, reduction in vertical space occupied by the load port allows for integrating auxiliary components into said vertical space. The auxiliary components can include substrate storage containers, metrology equipment, servers, air conditioning units, and others. In such a configuration, the total footprint of the electronic device manufacturing system is reduced by combining the spaces occupied by the load port and the auxiliary component, as compared to a traditional load port and auxiliary component. Floor space in fabrication facilities (fabs) for electronic devices is very costly, and any reduction in the footprint of electronic device manufacturing systems can reduce the cost of ownership of those electronic device manufacturing systems. Reducing the footprint of the systems also allows the owner to fit more systems into the limited fab space, which in turn allows the processing of more wafers. Thus, embodiments described herein provide load ports that reduce the footprint and overall cost of ownership of electronic device manufacturing systems.

In some embodiments, a load port for receiving a substrate carrier can include a frame adapted to connect the load port to a factory interface. The frame can include a transport opening through which one or more substrates are capable of being transported between the substrate carrier and the factory interface. In some embodiments, the frame includes an outer seal positioned around the transport opening capable of providing a sealing function between the load port and the substrate carrier. In some embodiments, the substrate carrier includes a carrier seal capable of providing a sealing function between the frame and the substrate carrier.

The load port can include an actuator coupled to the frame and a load port door, capable of sealing the transport opening, coupled to the actuator. In some embodiments, the frame includes an inner seal between the frame and the load port door. The inner seal can be positioned around the transport opening and be capable of providing a sealing function between the frame and the load port door. In some embodiments, the load port door includes a door seal capable of providing a sealing function between the frame and the load port door. The actuator can position the load port door from a closed position to an open position, and vice versa. The overall height of the load port can be greater than the height of the load port door, but less than 2.5 times the height of the load port door. The load port can mounted to a wall of the factory interface. Due to the compact size of the wall mounted load port, at least one auxiliary component (e.g., a substrate storage container, metrology equipment, a server, an air conditioning unit, etc.) can be positioned below the load port. In addition, the load port is capable of being mounted on a horizontal plane similar to that of a load lock used to transfer the substrates to process chambers for processing. As such, mounting the load port on the horizontal plane similar to that of the load lock eliminates excess motion (e.g., vertical motion) by a factory interface robot transferring substrates from the substrate carrier to the load lock.

By providing a system that reduces the size of the load port, the electronic device manufacturing system is provided with an increased foot print efficiency. Specifically, prior electronic device manufacturing systems position the load port vertically along a side of the factory interface, from the floor upwards, which takes up the majority or entirety of usable space in a vertical volume. In some embodiments of the present disclosure, the load port is shortened (by, for example, two feet) and is wall mounted (rather than floor standing), thus allowing for placement of one or more auxiliary components below the load port and integrating the load port and the auxiliary component(s) into a single volume. Therefore, the manufacturing system has a decreased footprint, which can improve overall system yield and/or cost (e.g., fabrication cost, materials cost, packaging cost, shipment cost, etc.).

Figure 1B:
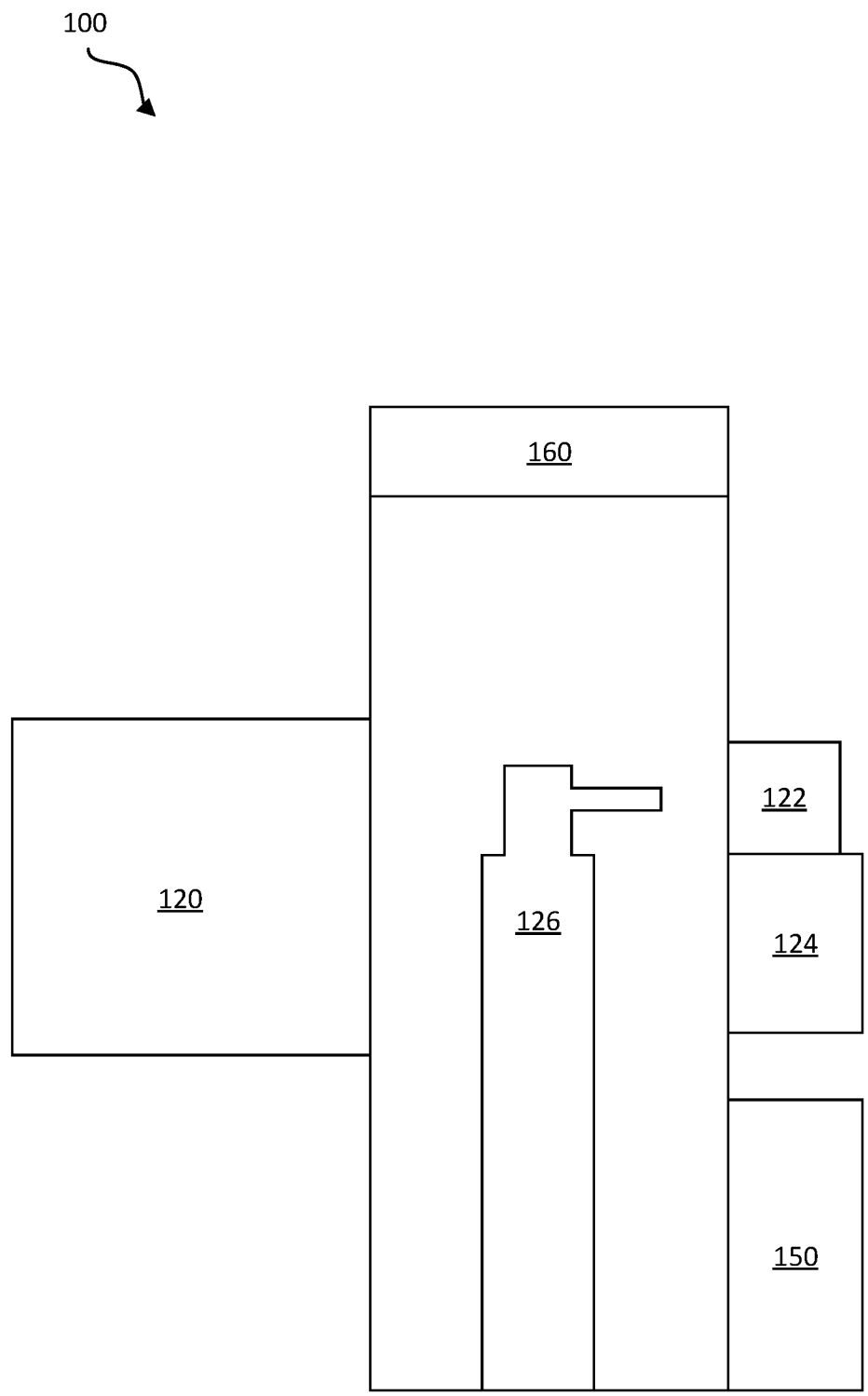
FIG. 1B is a side schematic view of an example electronic device manufacturing system, according to aspects of the present disclosure, according to aspects of the present disclosure.
Figure 1C:
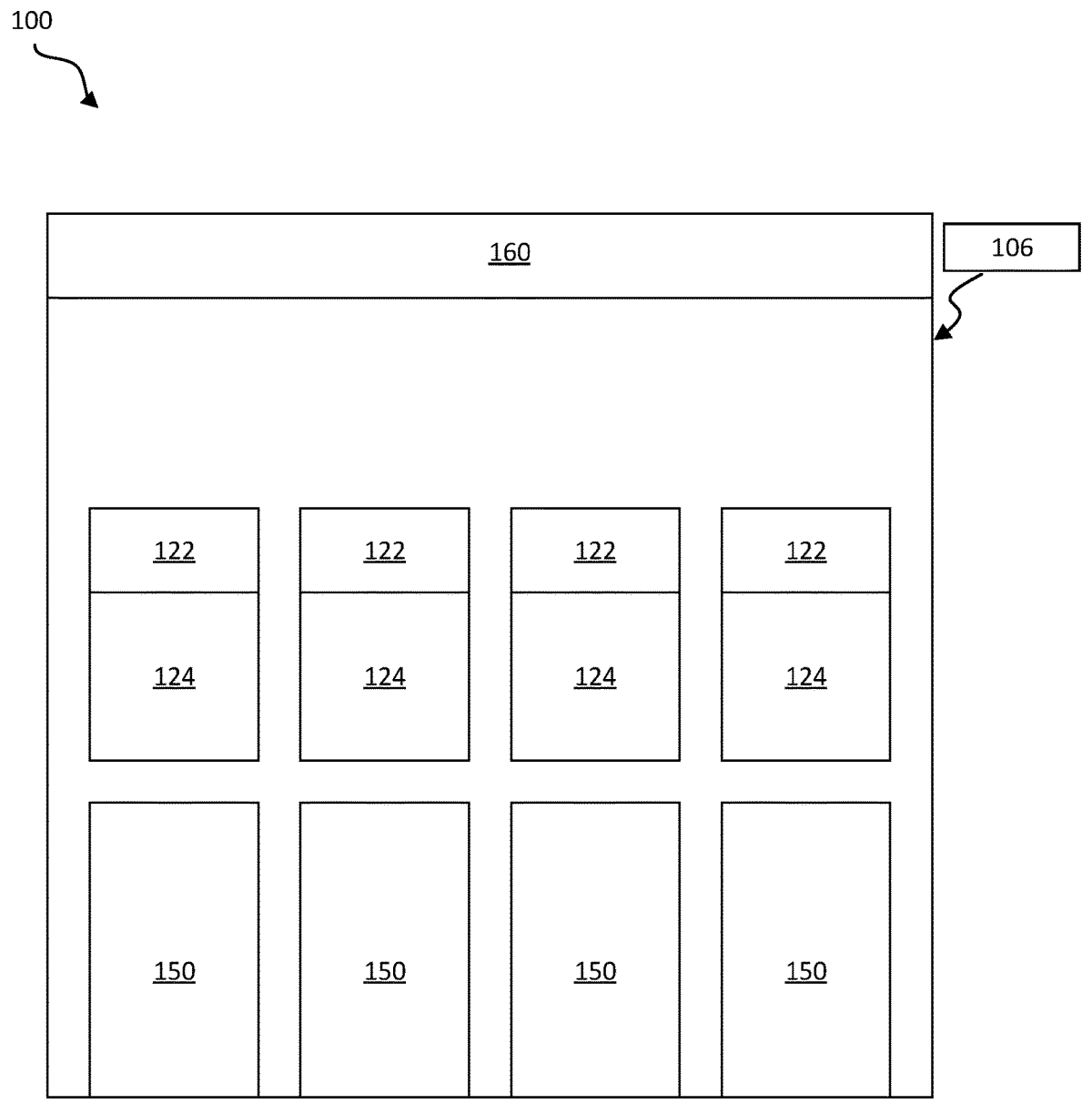

FIGS. 1A-1C describe an electronic device manufacturing system 100 where one or more load ports are coupled to a factory interface 106. FIG. 1A is a top schematic view of the example electronic device manufacturing system 100, according to aspects of the present disclosure. FIG. 1B is a side schematic view of the example electronic device manufacturing system 100, according to aspects of the present disclosure. FIG. 1C is a front schematic view of the example electronic device manufacturing system 100, according to aspects of the present disclosure. It is noted that FIGS. 1A-1C are used for illustrative purposes, and that different component can be positioned in different location in relation to each view.

Figure 2:
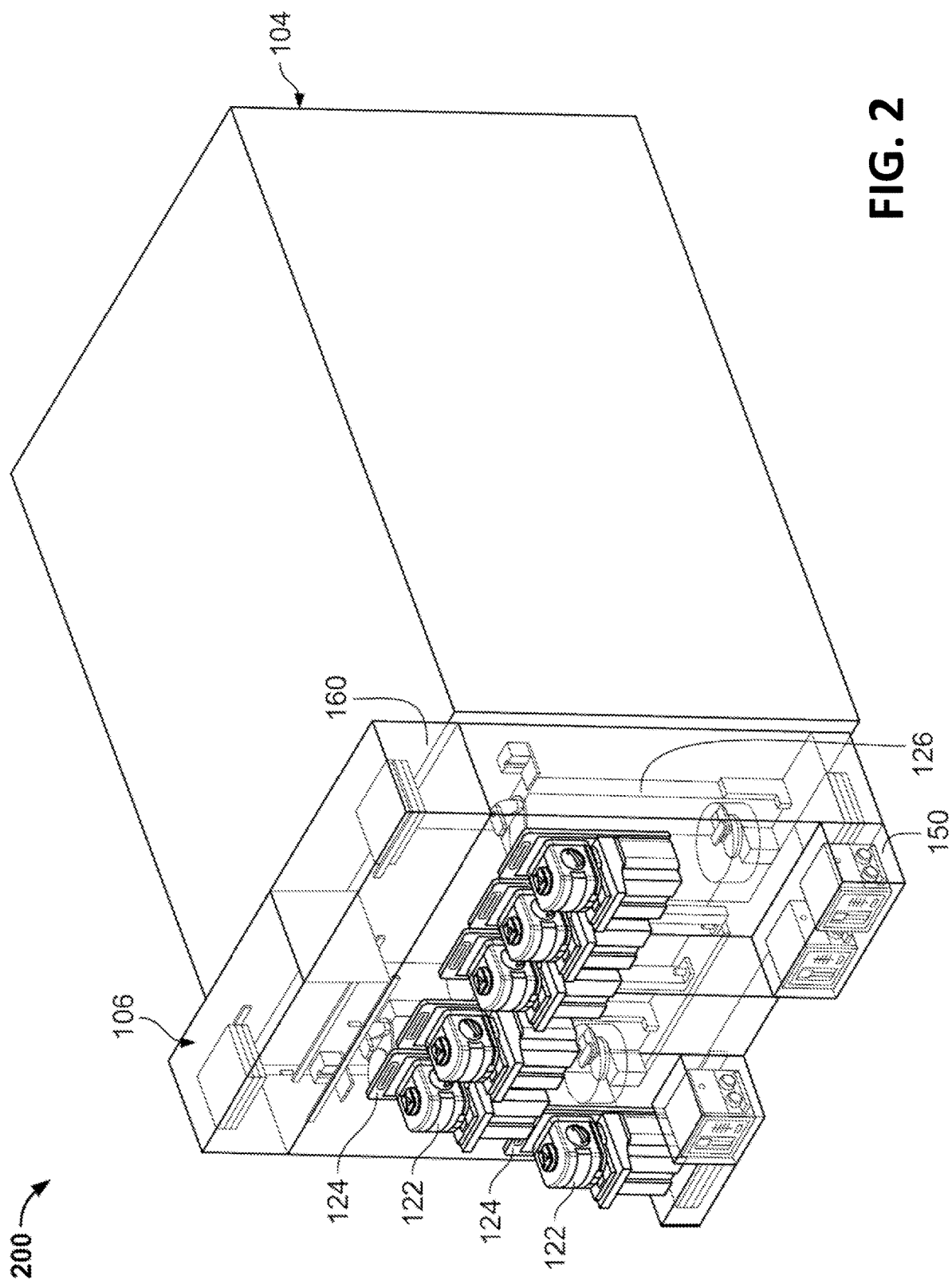
FIG. 2 is an isometric view of an electronic device manufacturing system, according to aspects of the present disclosure.

FIG. 2 illustrates an electronic device manufacturing system 200 which similarly has one or more load ports coupled to factory interface 106. Electronic device manufacturing system 200 can be similar or the same as electronic device manufacturing system 100. In particular, FIGS. 1A-1C illustrate different block views of electronic device manufacturing system 100 while FIG. 2 illustrates a computer aided design (CAD) isometric view of electronic device manufacturing system 200. It is noted that FIG. 2 is used for illustrative purposes, and that different components may be positioned in different locations in relation to each view.

Electronic device manufacturing systems 100 and 200 (also referred to as an electronics processing system) is configured to perform one or more processes on a substrate 102. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Electronic device manufacturing systems 100 and 200 includes a process tool (e.g., a mainframe) 104 and a factory interface 106 coupled to process tool 104. Process tool 104 includes a housing 108 having a transfer chamber 110 therein. Transfer chamber 110 includes one or more processing chambers (also referred to as process chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of process chambers 114, an etching process is performed in one or both of process chambers 116, and an annealing process is performed in one or both of process chambers 118. Other processes can be carried out on substrates therein. Processing chambers 114, 116, 118 can each include a substrate support assembly. The substrate support assembly can be configured to hold a substrate in place while a substrate process is performed.

Transfer chamber 110 also includes a transfer chamber robot 112. Transfer chamber robot 112 can include one or multiple arms where each arm includes one or more end effectors at the end of each arm. The end effector can be configured to handle particular objects, such as wafers. Alternatively, or additionally, the end effector is configured to handle objects such as process kit rings. In some embodiments, transfer chamber robot 112 is a selective compliance assembly robot arm (SCARA) robot, such as a 2 link SCARA robot, a 3 link SCARA robot, a 4 link SCARA robot, and so on.

A load lock 120 can also be coupled to housing 108 and transfer chamber 110. Load lock 120 can be configured to interface with, and be coupled to, transfer chamber 110 on one side and factory interface 106 on another side. Load lock 120 can have an environmentally-controlled atmosphere that is changed from a vacuum environment (where substrates are transferred to and from transfer chamber 110) to an at or near atmospheric-pressure inert-gas environment (where substrates are transferred to and from factory interface 106) in some embodiments. In some embodiments, load lock 120 is a stacked load lock having a pair of upper interior chambers and a pair of lower interior chambers that are located at different vertical levels (e.g., one above another). In some embodiments, the pair of upper interior chambers are configured to receive processed substrates from transfer chamber 110 for removal from process tool 104, while the pair of lower interior chambers are configured to receive substrates from factory interface 106 for processing in process tool 104. In some embodiments, load lock 120 are configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers (also referred to as containers) 122 and load lock 120. In other and/or similar embodiments, factory interface 106 is configured to receive replacement parts from replacement parts storage containers. Factory interface robot 126 can include one or more robot arms and can be or include a SCARA robot. In some embodiments, factory interface robot 126 has more links and/or more degrees of freedom than transfer chamber robot 112. Factory interface robot 126 can include an end effector on an end of each robot arm. The end effector can be configured to pick up and handle specific objects, such as wafers. Alternatively, or additionally, the end effector can be configured to handle objects such as process kit rings. Any conventional robot type can be used for factory interface robot 126. Transfers can be carried out in any order or direction. Factory interface 106 can be maintained in, e.g., a slightly positive-pressure non-reactive gas environment (using, e.g., nitrogen as the non-reactive gas) in some embodiments.

Factory interface 106 can be configured with any number of load ports 124, which can be located at one or more sides of the factory interface 106 and at the same or different elevations. One or more load ports 124 can be of a design that occupies a minimal amount of vertical space on the factory interface 106, according to aspects of the present disclosure. These load ports will be discussed in greater detail with respect to FIGS. 2A-2B and 3. In some embodiments, load ports 124 can be located at different elevations along the walls of factory interface 106. Elevating the load ports 124 allows for placement of one or more auxiliary components 150 at the base of factory interface 106, below the load port(s) 124.

Referring to FIGS. 1B-1C, factory interface 106 can include one or more auxiliary components 150. The auxiliary components 150 can include substrate storage containers, metrology equipment, servers, air conditioning units, etc. A substrate storage container can store substrates and/or substrate carriers (e.g., FOUPs), for example. Metrology equipment can be used to determine property data of the products that were produced by the electronic device manufacturing system 100. In some embodiments, factory interface 106 can include upper compartment 160, as seen in FIGS. 1B-1C. Upper compartment 160 can house electronic systems (e.g., servers, air conditioning units, etc.), utility cables, system controller 128, or other components.

In some embodiments, transfer chamber 110, process chambers 114, 116, and 118, and/or load lock 120 are maintained at a vacuum level. Electronics processing system 100 can include one or more vacuum ports that are coupled to one or more stations of electronic device manufacturing system 100. For example, first vacuum ports 130a can couple factory interface 106 to load locks 120. Second vacuum ports 130b can be coupled to load locks 120 and disposed between load locks 120 and transfer chamber 110.

In some embodiments, one or more utility lines (not shown) are configured to provide utilities to factory interface 106. The utility lines can include a power utility line configured to provide power to factory interface 106, an air utility line configured to provide air to factory interface 106 (e.g., a clean dry air (CDA) utility line), a vacuum utility line configured to provide a vacuum to first vacuum ports 130a and/or to the interior chamber of the factory interface 106, and/or a nitrogen utility line configured to provide nitrogen to factory interface 106.

One of more utility cables can be configured to protect the one or more utility lines. For example, each utility line can be enclosed within a utility cable. Multiple utility lines can be enclosed within the same utility cable and/or utility lines can be included within separate utility cables. A first end of each utility cable can be mounted to an outlet of a utility supply (e.g., a power supply, an air supply, a vacuum pump, a nitrogen supply, etc.). In some embodiments, the outlet of a utility supply is connected to the floor (or a wall) of electronic device manufacturing system 100. As such, the first end of each utility cable can be mounted to the ground of the fab (e.g., the ground over which the factory interface 106 is installed). A second end of each utility cable can be mounted to an inlet of factory interface 106. In some embodiments, the inlet is located at a bottom of factory interface 106. As such, the second end of each utility cable is mounted to the bottom of factory interface 106.

Electronic device manufacturing system 100 can also include a system controller 128. System controller 140 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). System controller 128 can include an environmental controller configured to control an environment (e.g., pressure, moisture level, vacuum level, etc.) within factory interface 106. In embodiments, execution of the instructions by system controller 128 causes system controller to perform the methods of FIG. 6. System controller 140 can also be configured to permit entry and display of data, operating commands, and the like by a human operator.

Figure 3A:
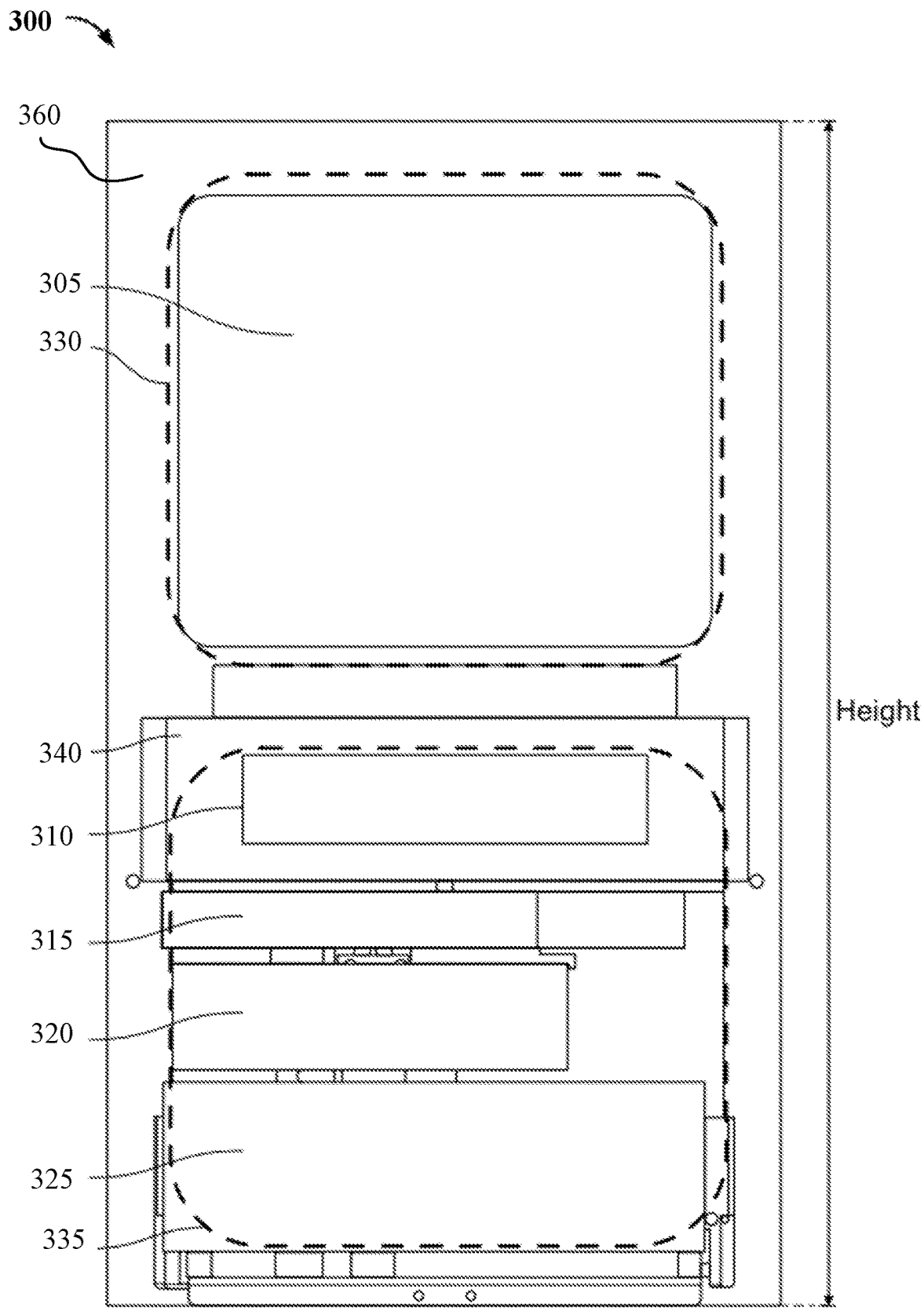
FIG. 3A is a front schematic view of an example load port, according to aspects of the present disclosure.
Figure 3B:
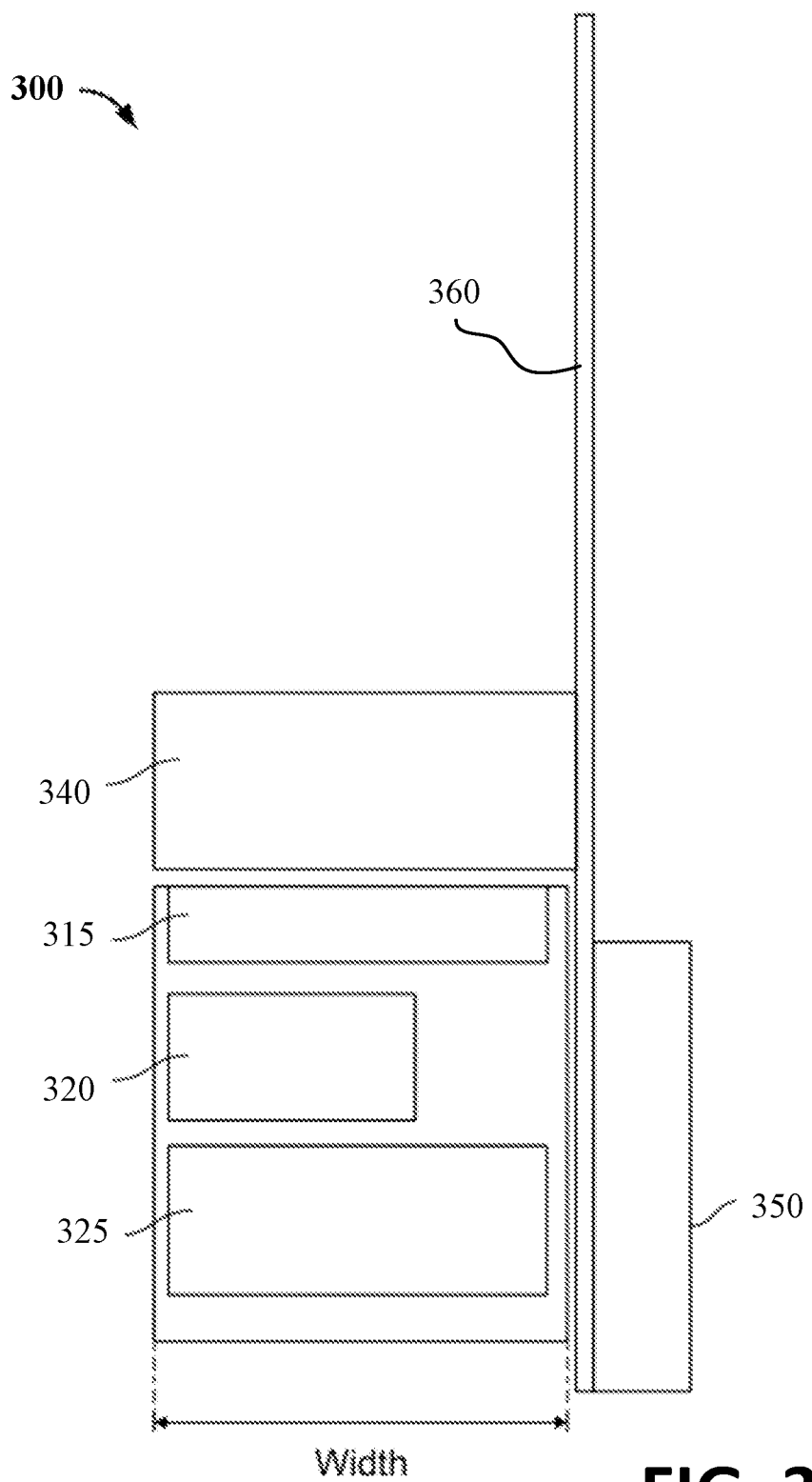
FIG. 3B is a side schematic view of an example load port, according to aspects of the present disclosure.

FIGS. 3A-3B describe an example load port 300 including frame 360, indicator light 310, load port controller 315, pneumatic control 320, purge kit 325, and stage 340 in accordance with one embodiment of the present disclosure. The component and functions of load port 300 can be similar to load port 124. FIG. 3A is a front schematic view of the example load port 200, in accordance with one embodiment of the present disclosure. FIG. 3B is a side schematic view of the example load port 300, in accordance with one embodiment of the present disclosure.

As illustrated in FIG. 3A, a load port door 305 can be positioned in closed position 330 to secure to a transport opening to maintain environmentally-controlled atmosphere in the factory interface 106. The load port door 305 can be positioned in open position 335 using a door mechanism, as will be described in greater detail in FIG. 5. While in the open position 335, the transport opening in frame 360 enables substrates (e.g., wafers) to be transferred between a substrate carrier 122 coupled to load port 300 and factory interface 106 using a factory interface robot 126. In some embodiments, the load port door 305 can couple to the substrate carrier door. As such, responsive to the load port door 305 being positioned to the open position 335, the load port door 305 can remove the substrate carrier door from the substrate carrier. Accordingly, responsive to the load port door 305 being positioned to the closed position 330, the load port door 305 can attach the substrate carrier door to the substrate carrier. In some embodiments, frame 360 includes an outer seal positioned around the transport opening capable of providing a sealing function between load port 300 and substrate carrier 122. In some embodiments, substrate carrier 122 includes a carrier seal capable of providing a sealing function between load port 300 and substrate carrier 122. In some embodiments, frame 360 includes an inner seal between the frame 360 and load port door 305. The inner seal can be positioned around the transport opening and be capable of providing a sealing function between frame 360 and load port door 305. In some embodiments, load port door 305 includes a door seal capable of providing a sealing function between frame 360 and load port door 305.

Load port 300 can be designed to occupy a minimal amount of vertical space on the factory interface 106. In some embodiments, the height of frame 360 of load port 300 can be correlated to the vertical space occupied by the load port door 305 in the open position 335 and in the closed position 330. In particular, the height of load port 300 can be approximately twice the height of load port door 305. By way of illustrative example, load port door 305 can have a height of approximately 315 millimeters. Accordingly, load port 300 can have a height of approximately 650 millimeters or less, which is approximately twice the height of load port door 305, and significantly less than the over 1300 millimeter height of conventional load ports. As illustrated by way of exemplary example in FIG. 3B, load port 300 can have a width of approximately 450 millimeters or less. Load port 300 can comply with SEMI (Semiconductor Equipment and Materials International) standards and requirements.

Indicator light 310 can indicate whether load port door 305 is in the closed position 330 or in the open position 335. For example, indicator light 310 can be turned on in response to the load port door 305 being in the open position 335, and turned off in response to the load port door 305 being in the closed position 330. In other embodiments, indicator light 310 can indicate whether a substrate carrier 122 is properly secured to the load port 300.

Load port controller 315 can be and/or include a computing device such as a programmable logic controller (PLC), a microcontroller, and so on. Load port controller 315 can include one or more processing devices, which can be general-purpose processing devices such as a microprocessor, central processing unit, or the like. Load port controller 315 can include a data storage device (e.g., one or more disk drives and/or solid state drives), a main memory, a static memory, a network interface, and/or other components. Load port controller 315 can execute instructions to perform any one or more of the methodologies and/or embodiments described herein. For example, load port controller 315 can operate the load port door (e.g., position the load port door 305 into the open position 335, position the load port door 305 into the closed position 330), turn on/off indicator light 310, activate and deactivate and/or communicate with pneumatic control 320, purge kit 325, particle trapping mechanism 350, etc. The instructions can be stored on a computer readable storage medium, which can include the main memory, static memory, secondary storage and/or processing device (during execution of the instructions). In embodiments, execution of the instructions by load port controller 315 can perform, at least in part, the methods of FIG. 6. Load port controller 315 can also be configured to permit entry and display of data, operating commands, and the like by a human operator or by system controller 140. In some embodiments, load port controller 315 can include a radio frequency identification (RFID) system to perform automatic lot identification during the substrate loading and unloading process.

Pneumatic control 320 can operate a pneumatic device or a similar mechanism by using differential pressures and/or flows to push flexible diaphragms connected to mechanical values and similar devices to operate switches, open or close valves, move dampers, etc. By way of example, pneumatic control 320 can operate the pneumatic device using compressed air or gasses. The pneumatic device can be coupled to load lock door 305. Pneumatic control 320 can receive instructions from and/or be operated by load port controller 315. For example, load port controller 315 can command pneumatic control 320 to position load port door 305 into the open position 335 and into the closed position 330.

Purge kit 325 allows for purging of a substrate carrier 122 with nitrogen ($N_2$) or any other practicable inert gas such as argon when the substrate carrier 122 is being processed by the electronic device manufacturing system 100 and 200. Purge kit 325 can include one or more inter-substrate purge nozzle arrays, one or more curtain nozzle arrays, etc. The combination of the gas flows from the nozzle arrays can be controlled by load port controller 315 to achieve an optimum purge of the substrate carrier 122. Stage 340 can horizontally protrude from the load port 300 and can support a placement of substrate carriers 122.

Load port 300 can have one or more sets of mounting holes and/or mounting brackets to couple load port 300 to the factory interface 106. By way of illustrative example, load port 300 can include two sets of mounting holes. For example, a first pair of mounting holes can be located at the front upper corners of load port 300, and a second pair of mounting holes can be located at the front lower corner of load port 300. By way of comparison, conventional load ports require three sets of mounting holes (a top set, a middle set, and a bottom set). Thus, load port 300 can be coupled to a wall of the factory interface 106 using fewer fasteners (e.g., bolts, screws, rivets, etc.). In some embodiments, load port 300 can be mounted onto a wall of the factory interface 106 using one or more mounting racks. Mounting load port 300 can comply with SEMI standards and requirements.

In some embodiments, rather mounting the entire load port 300 to the factory interface 106, load port 300 can be mounted to the factory interface 106 via two or more assemblies. For example, a first assembly can include the load port frame 360, load port door 305 and a door mechanism (e.g., door mechanism 500 of FIG. 5), and the second assembly can include one or more of indicator light 310, load port controller 315, pneumatic control 320, purge kit 325, and stage 340. Mounting the load port 300 using multiple assemblies can provide easier access to the components of the load port, enabling reduced maintenance and repair time.

As illustrated in FIG. 3B, load port 300 can include particle trapping mechanism 350. Particle trapping mechanism 350 can be any type of component or mechanism designed to catch particles (e.g., dust particles) generated by the motion of load port door 305, by purge kit 325, etc. Thus, particle trapping mechanism 350 can prevent particles from the substrate carrier 122 from contaminating the factory interface 106. In some embodiments, the particle trapping mechanism 350 can be positioned at or around the lower lip of the load port 300 opening. In some embodiments, particle trapping mechanism 350 can include an exhaust system. The exhaust system can guide collected particles out of the factory interface 106, into a collection mechanism, etc.

Figure 4A:
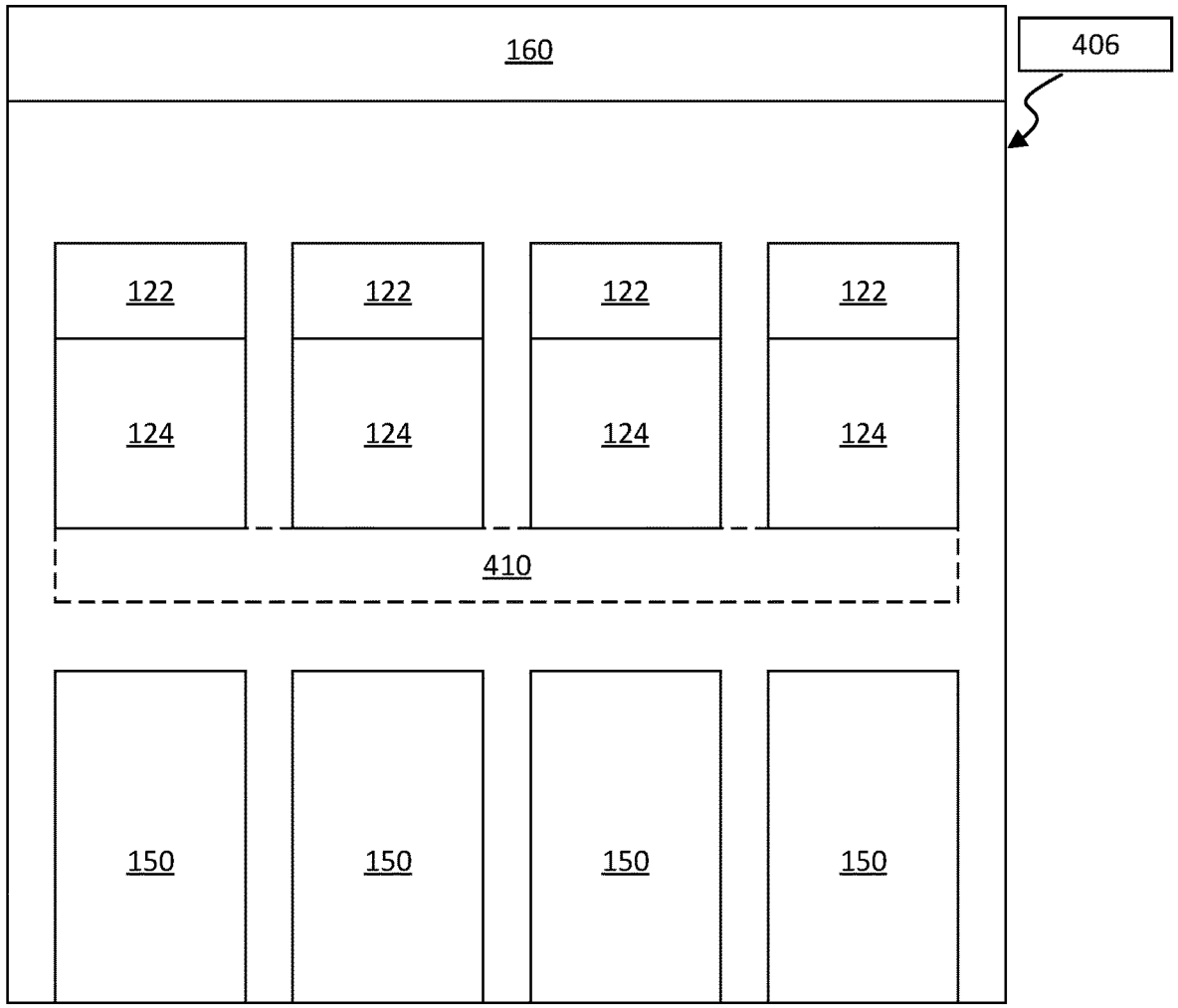
FIGS. 4A-4B describe a factory interface with a single particle trapping mechanism, according to aspects of the present disclosure.
Figure 4B:
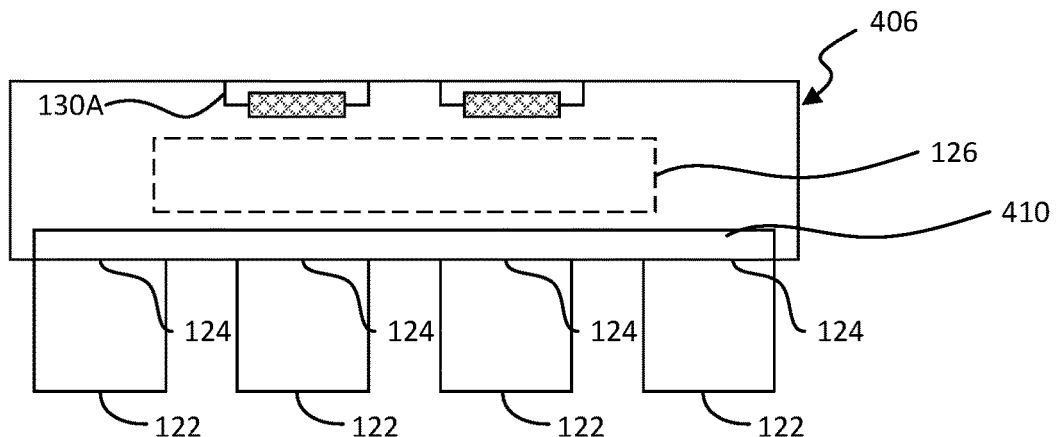

In some embodiments, the particle trapping mechanism 350 can include a single component or mechanism configured to catch particles generated by the motion of each load port door of the factory interface. FIGS. 4A-4B describe a factory interface illustrating an example particle trapping mechanism 410. Factory interface 406 can be similar to or the same as factory interface 106. As shown, particle trapping mechanism 410 spans across the front wall of factory interface 406 to catch particles generated by the motion of each load port door 124 of the factory interface 406. In some embodiments, multiple trapping mechanisms can be used to trap particles from one or more sets of load port doors 124. For example, a first particle trapping mechanism can trap particles from the two left load port doors 124, and a second particle trapping mechanism can trap particles from the two right load port doors 124.

Figure 4C:
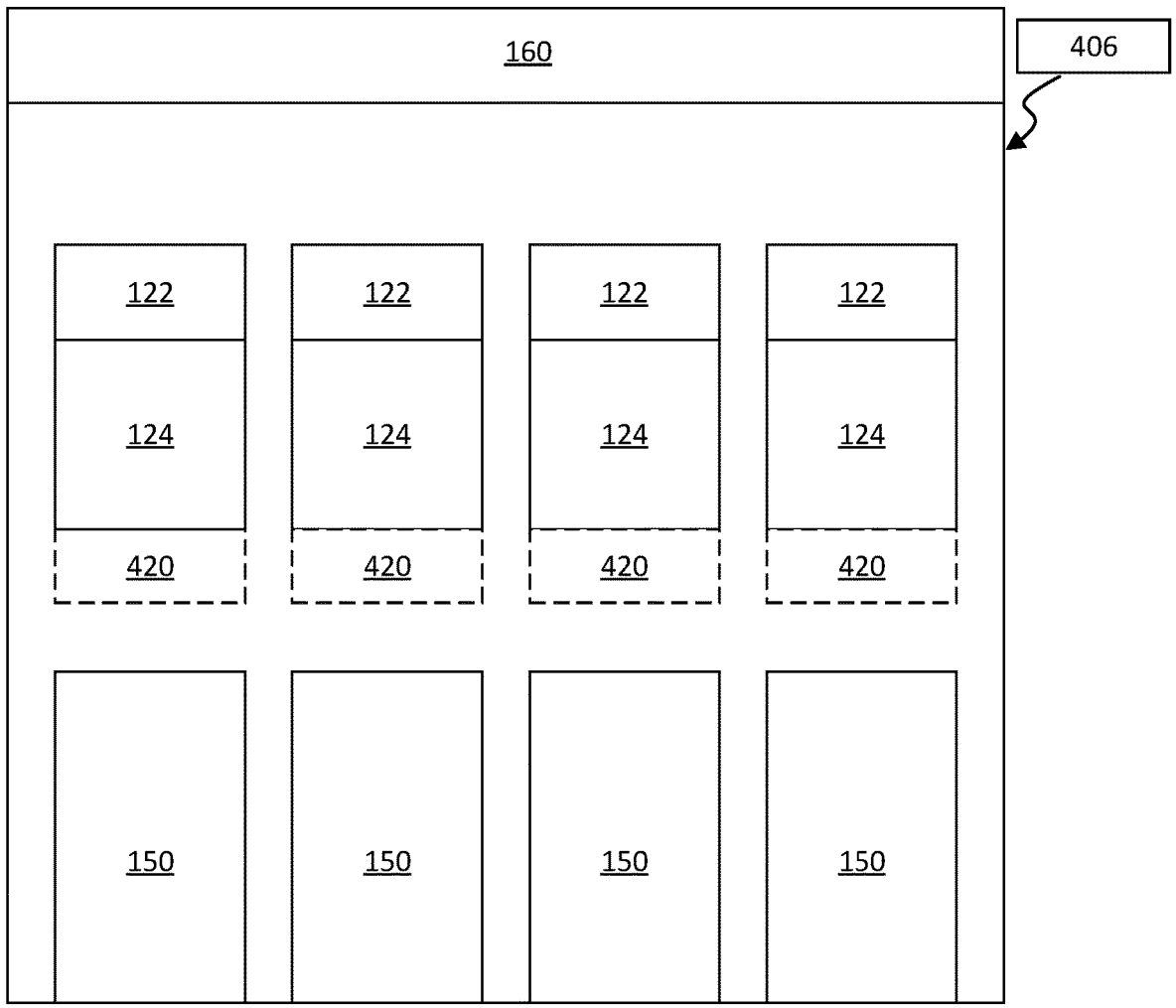
FIGS. 4C-4D describe a factory interface with example particle trapping mechanisms for each load port door, according to aspects of the present disclosure.
Figure 4D:
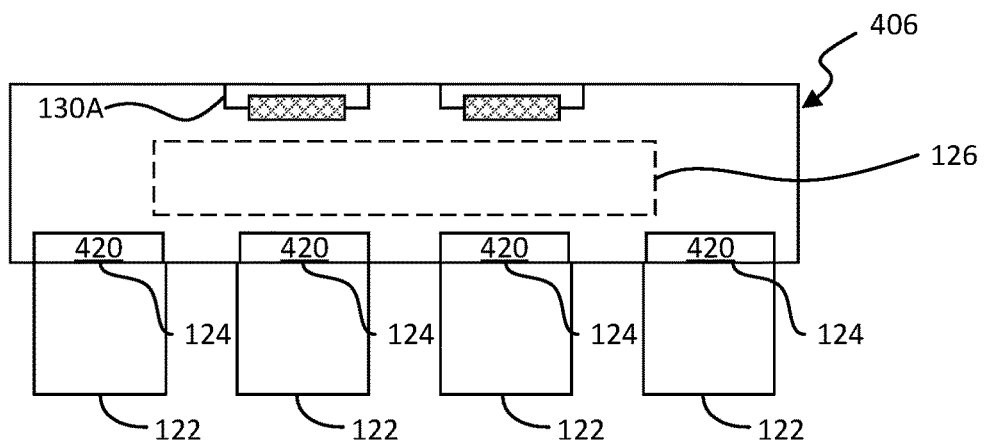

In some embodiments, the factory interface can include a particle trapping mechanism 350 for each load port door. FIGS. 4C-4D describe a factory interface illustrating example particle trapping mechanisms 420 for each load port door. Factory interface 406 can be similar to the same as factory interface 106. As shown, each load port door 124 is configured with a particle trapping mechanism 420 to catch particles generated by the motion of the respective load port door 124.

Figure 5:
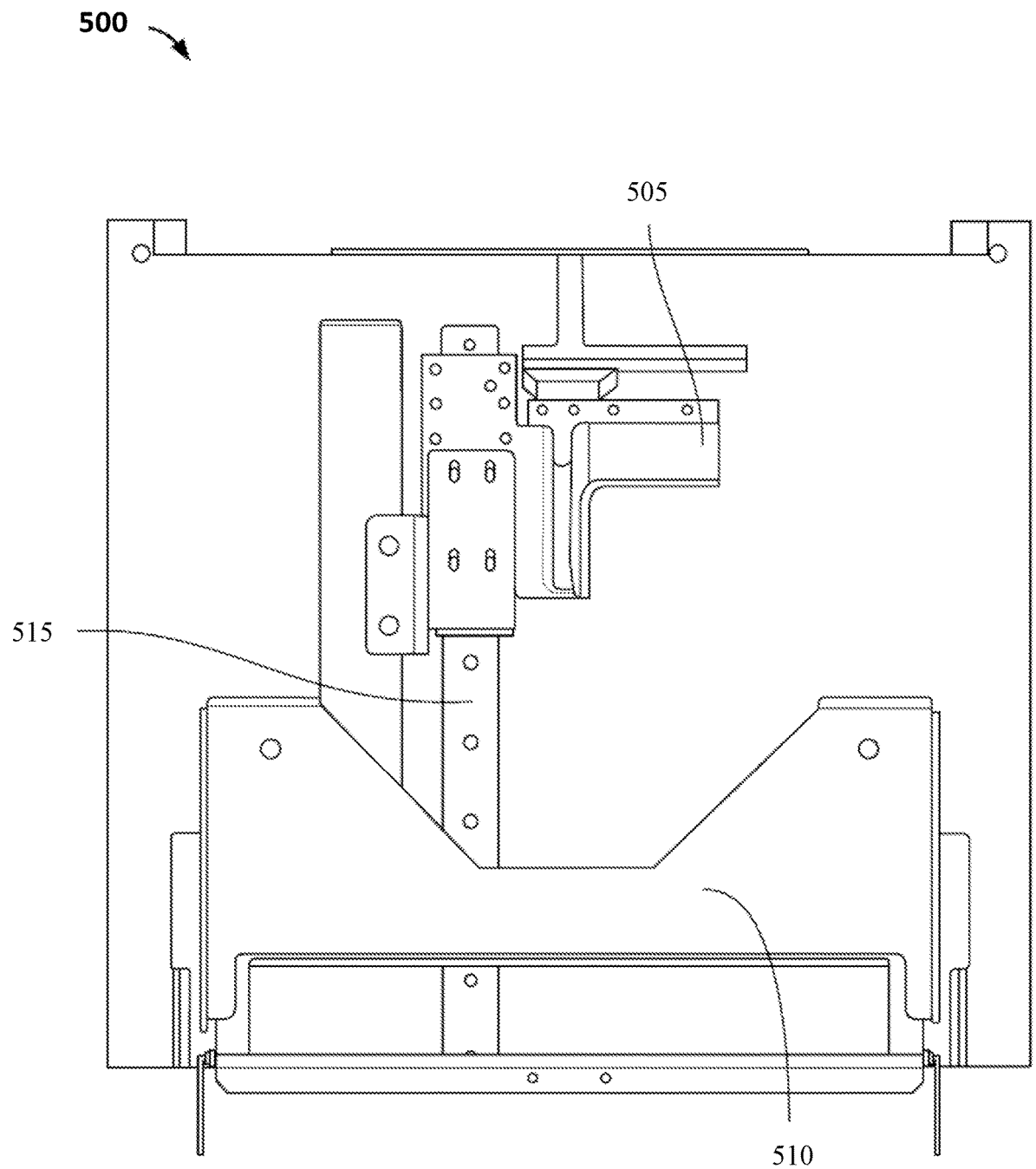
FIG. 5 is a front schematic view of an example door mechanism, according to aspects of the present disclosure.

FIG. 5 is a front schematic view of an example door mechanism 500, in accordance with embodiments of the present disclosure. Door mechanism 300 can position load port door 305 into the open position 335 and into the closed position 330. Door mechanism 500 can include actuator 505 and outrigger 510.

Actuator 505 can include one or more pneumatic devices, electromechanically driven devices, or similar mechanisms, where the pneumatic device(s) is capable of using compressed air or gasses to slide actuator 505 vertically along bar 515. Actuator 305 can be coupled to load port door 305. In some embodiments, the pneumatic device can slide actuator 305 upwards along bar 315 to position load port door 305 into the closed position 330, and can slide actuator 305 downward along bar 315 to position load port door 305 into the open position 335. In some embodiments, actuator 305 can include components capable of enabling the load port door 305 to swing open (e.g., move in an arc motion) from the closed portion 330 into the open position 335, and vice versa. It is noted that actuator 505 can be positioned below and substantially near the transport opening. For example, the height of load port 300 can be approximately twice the height of load port door 305, where the transport opening is situated in the upper half of the load port 300 and the actuator 505 is situated in the lower half the load port 300. Accordingly, actuator 505 is positioned substantially closer to the load port 300 than the actuators of conventional load ports. In other embodiments, actuator 505 can be positioned to the side of and substantially near the transport opening. In yet other embodiments, actuator 505 can be positioned to the top of and substantially near the transport opening.

Pneumatic control 320 can operate a pneumatic device by using differential pressures and/or flows to push flexible diaphragms connected to mechanical values and similar devices to operate switches, open or close valves, move dampers, etc. By way of example, pneumatic control 320 can operate the pneumatic device using compressed air or gasses. The pneumatic device can be coupled to load port door 305. Pneumatic control 320 can receive instructions from and/or be operated by load port controller 315. For example, load port controller 315 can command pneumatic control 320 to position load port door 305 into the open position 335 and into the closed position 330.

Outrigger 510 can be any type of structure, such as a shelf or bracket, to support movement or handling of the load port when the load port is not coupled to the factory interface. In some embodiments, outrigger 510 can be an optional and removable component.

In other embodiments, a load port door can be attached to a pivot mechanism. The pivot mechanism can be attached to at least one side of a front face of a load port. Once the load port is connected to a factory interface (e.g., factory interface 106), a factory interface robot (e.g., factor interface robot 126) or actuator can disengage the load port door, and position the load port door from a closed position into an open position by moving the load port door horizontally and/or vertically and/or rotating the load port door around an axis of the pivot mechanism. The axis may be a vertical axis or a horizontal axis in embodiments. By way of exemplary example, the factory interface robot or actuator can rotate the door around the axis of the pivot mechanism approximately 90 degrees. Accordingly, the pivot mechanism enables the load port to have an overall height of approximately the height of the load port door, and an overall width of approximately the width of load port door. In an example, the door may be translated vertically and/or horizontally to clear a path in front of an opening of the load port. The vertical and/or horizontal translation may be accompanied by rotation as described above.

In some embodiments, actuator 505 and bar 515 (along with any other components) can be positioned above the transport opening (not shown). In such embodiments, the pneumatic device can slide actuator 505 downwards along bar 515 to position load port door 305 into the closed position 330, and can slide actuator 505 upward along bar 515 to position load port door 305 into the open position 335. By positioning actuator 505 and bar 515 above the transport opening, the space under the transport opening can be maximized. In some embodiments, such a configuration can further include a shield to divert downward laminar flow away from the transport opening. In some embodiments, the shield can be positioned above the transport opening.

Figure 6:
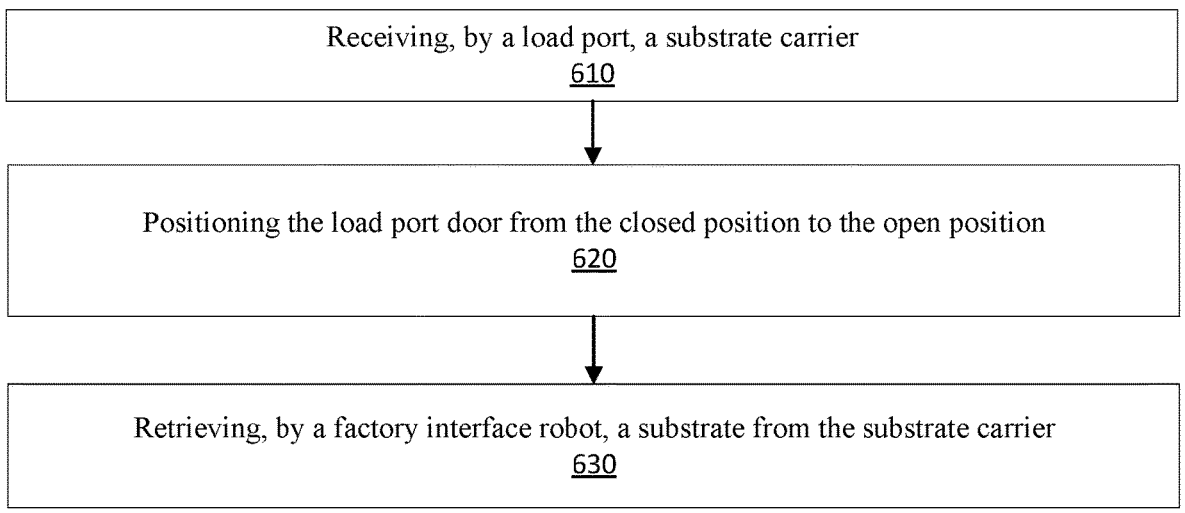
FIG. 6 is a method for method for transporting substrates from a substrate carrier to a factory interface, in accordance with embodiments of the present disclosure.

FIG. 6 is a method for transporting substrates from a substrate carrier to a factory interface, in accordance with embodiments of the present disclosure. At block 610, a load port receives a substrate carrier. In an example, the substrate carrier is a FOUP. In some embodiments, the load port includes a frame adapted for connecting the load port to the factory interface. The frame includes a transport opening through which one or more substrates are capable of being transported between the substrate carrier and the factory interface. The load port also includes a actuator coupled to the frame and a load port door coupled to the actuator. The load port door can be configured to seal the transport opening. The actuator is capable of positioning the load port door from a closed position to an open position, and from the open position to the closed position. The frame height can be greater than the height of the load port door, and less than 2.5 times the height of the load port door.

At block 620, the load port door is positioned from the closed position to the open position via, for example, the door mechanism operated by the load port controller. At block 630, a factory interface robot deposed within the factory interface retrieves a substrate from the substrate carrier. In some embodiments, prior to positioning the load port door from the closed position to the open position, the load port controller can engage a purge kit to purge the substrate carrier with an inert gas.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A load port for receiving a substrate carrier, comprising:
   a frame adapted for connecting the load port to a factory interface and configured to be wall mountable at a plurality of positions on a front face of the factory interface, the frame comprising a transport opening through which one or more substrates are capable of being transported between the substrate carrier and the factory interface;
   an actuator coupled to the frame; and
   a load port door coupled to the actuator and configured to seal the transport opening, wherein the actuator is configured to adjust the load port door from a first position to a second position to open the load port door, and from the second position to the first position to seal the load port door, wherein:
   the load port door comprises a first measurement between a top of the load port door and a bottom of the load port door;
   the frame comprises a second measurement between a top of the frame and a bottom of the frame; and
   the second measurement is greater than the first measurement, and less than 2.5 times the first measurement.

2. The load port of claim 1, wherein the load port is mounted to the wall of the factory interface, and wherein the actuator is a pneumatic driven actuator or an electromechanically driven actuator.

3. The load port of claim 1, wherein the first measurement is approximately 315 millimeters, and the second measurement is less than or equal to 650 millimeters.

4. The load port of claim 1, further comprising a purge kit for purging the substrate carrier with an inert gas.

5. The load port of claim 1, further comprising:
   at least one of a substrate storage container, metrology equipment, a server, or an air conditioning unit positioned below the load port.

6. The load port of claim 1, further comprising:
   a particle trapping mechanism designed to collect particles generated by a motion of load port door.

7. The load port of claim 6, wherein the particle trapping mechanism comprises an exhaust system to guide collected particles out of the factory interface.

8. The load port of claim 6, wherein the particle trapping mechanism is designed to collect particles generated by each load port door of the factory interface.

9. The load port of claim 1, wherein the actuator is coupled to the frame substantially close to the transport opening.

10. An electronic device manufacturing system, comprising:
- a factory interface; and
- at least one load port for receiving a substrate carrier, comprising:
  - a frame adapted for connecting the load port to the factory interface and configured to be wall mountable at a plurality of positions on a front face of the factory interface, the frame comprising a transport opening through which one or more substrates are capable of being transported between the substrate carrier and the factory interface;
  - an actuator coupled to the frame; and
  - a load port door coupled to the actuator and capable of sealing the transport opening, wherein the actuator is capable of adjusting the load port door from a first position to a second position, and from the second position to the first position, wherein:
    - the load port door comprises a first measurement between a top of the load port door and a bottom of the load port door;
    - the frame comprises a second measurement between a top of the frame and a bottom of the frame; and
    - the second measurement is greater than the first measurement, and less than 2.5 times the first measurement.

11. The electronic device manufacturing system of claim 10, wherein the load port is mounted to the wall of the factory interface, and wherein the actuator is a pneumatic driven actuator or an electromechanically driven actuator.

12. The electronic device manufacturing system of claim 10, wherein the first measurement is approximately 315 millimeters, and the second measurement is less than or equal to 650 millimeters.

13. The electronic device manufacturing system of claim 10, wherein the load port further comprises:
- a purge kit for purging the substrate carrier with an inert gas.

14. The electronic device manufacturing system of claim 10, wherein the load port further comprises:
- at least one of a substrate storage container, metrology equipment, a server, or an air conditioning unit positioned below the load port.

15. The electronic device manufacturing system of claim 10, wherein the load port is connected to a factory interface wall using a mounting bracket.

16. The electronic device manufacturing system of claim 10, wherein the load port further comprises:
- a particle trapping mechanism designed to collect particles generated by a motion of load port door.

17. The load port of claim 16, wherein the particle trapping mechanism comprises an exhaust system to guide collected particles out of the factory interface.

18. A method for transporting substrates from a substrate carrier into a factory interface, comprising:
- receiving, by a load port, a substrate carrier; wherein the load port comprises:
  - a frame adapted for connecting the load port to the factory interface and configured to be wall mountable at a plurality of positions on a front face of the factory interface, the frame comprising a transport opening through which one or more substrates are capable of being transported between the substrate carrier and the factory interface;
  - an actuator coupled to the frame; and
  - a load port door coupled to the actuator and capable of sealing the transport opening, wherein the actuator is capable of adjusting the load port door from a first position to a second position, and from the second position to the first position, wherein:
    - the load port door comprises a first measurement between a top of the load port door and a bottom of the load port door;
    - the frame comprises a second measurement between a top of the frame and a bottom of the frame; and
    - the second measurement is greater than the first measurement, and less than 2.5 times the first measurement;
- positioning the load port door from the first position to the second position using the actuator; and
- retrieving, by a factory interface robot deposed within the factory interface, a substrate from the substrate carrier.

* * * * *